(12) United States Patent  
Sato et al.

(10) Patent No.: US 8,385,830 B2  
(45) Date of Patent: *Feb. 26, 2013

(54) WIRELESS COMMUNICATION TERMINAL AND SOUND VOLUME CONTROL METHOD

(75) Inventors: Hiroto Sato, Tokyo (JP); Toshiya Tamura, Tokyo (JP)

(73) Assignee: Fujitsu Mobile Communications Limited, Kawasaki (JP)

( * ) Notice: Subject to any disclaimer, the term of this patent is extended or adjusted under 35 U.S.C. 154(b) by 166 days.

This patent is subject to a terminal disclaimer.

(21) Appl. No.: 12/837,622

(22) Filed: Jul. 16, 2010

(65) Prior Publication Data

US 2011/0014873 A1  Jan. 20, 2011

(30) Foreign Application Priority Data

Jul. 17, 2009  (JP) ................................ P2009-169239  
Jul. 17, 2009  (JP) ................................ P2009-169240

(51) Int. Cl.  
*H04B 7/00*  (2006.01)

(52) U.S. Cl. ...................... 455/41.3; 455/41.1; 455/41.2; 379/374.01; 379/374.02; 381/74; 381/109

(58) Field of Classification Search ................. 455/41.1, 455/41.2, 41.3, 272.6, 426.1, 567, 569.1, 455/569.2, 575.2; 381/74, 109, 370, 371, 381/372, 373; 379/374.01, 374.02, 374.03

See application file for complete search history.

(56) References Cited

U.S. PATENT DOCUMENTS

2006/0271968 A1*  11/2006  Zellner ........................... 725/81  
2007/0142942 A1*   6/2007  Hyatt ............................. 700/94

FOREIGN PATENT DOCUMENTS

JP  2002-176487 A  6/2002  
JP  2006-270601 A  10/2006

OTHER PUBLICATIONS

Bluetooth Hands-Free Profile 1.5 (Bluetooth SIG); pp. 27-31; 50-52, 78, 79. Nov. 25, 2005.  
JP Office Action mailed on Nov. 13, 2012 in application No. 2009-169239.

* cited by examiner

*Primary Examiner* — Tuan H Nguyen  
(74) *Attorney, Agent, or Firm* — Maschoff Gilmore & Israelsen

(57) ABSTRACT

A wireless communication terminal comprising a network communication unit, short distance wireless communication unit, an input unit and a control unit. The network communication unit transmits radio signals to communication network via a base station. The short distance wireless communication unit transmits radio signals to and from an external device. The short distance wireless communication unit establishes a voice link between the wireless communication terminal and the external device to transmit sound data. The control unit discards a volume update notification received from the external device via the short distance wireless communication unit if the voice link has not been established.

5 Claims, 6 Drawing Sheets

WIRELESS COMMUNICATION TERMINAL AND SOUND VOLUME CONTROL METHOD

CROSS-REFERENCE TO RELATED APPLICATION

This application is based upon and claims the benefit of priority from Japanese Patent Application No. 2009-169239, filed Jul. 17, 2009 and No. 2009-169240, filed Jul. 17, 2009; the entire contents of which are incorporated herein by reference.

FIELD

Embodiments disclosed herein relate generally to a wireless communication terminal and a sound volume control method.

BACKGROUND

Recently, for example, as a wireless communication technology applicable to an electronic apparatus and the like, Bluetooth® has been known. As a call control profile of the Bluetooth®, a "Hands-Free Profile (HFP)" has been known. The HFP defines a function by which an electronic apparatus such as cell phone controls volume of external device.

When a HFP connection is established between the cell phone and the external device, after an establishment of a lower layer is completed, support function notification is transmitted to the cell phone from the external device. If the external device supports the sound volume control, the support notification includes information representing that the sound volume control is supported. Then, if the HFP connection is established, volume update notification is notified to the cell phone from the external device. According to an initial volume update notification after the HFP connection is established, an initial volume level of the external device is notified to the cell phone from the external device (see FIG. 6). The cell phone receives the support notification of the volume control from the external device and receives the volume update notification (notification of the initial volume level) after the HFP connection is established, so that volume control instruction for the external device is possible. The volume control instruction of the cell phone with respect to the external device represents a function by which the cell phone instructs volume adjustment of the external device. Further, after the volume control instruction of the cell phone with respect to the external device is possible, when volume adjustment based on a volume adjustment operation is performed in the external device, volume update notification is transmitted to the cell phone from the external device.

In addition, according to the HFP, when an incoming call is received in the cell phone, a ringtone called an in-band ringtone can be notified to the external device. According to a function of notifying the in-band ringtone, a voice link is established when the cell phone receives an incoming call, and the cell phone encodes a ringtone and loaded the encoded ringtone on the voice link. The external device receives and decodes the encoded ringtone then plays the decoded ringtone. In general, it is considered that, in relation to the in-band ringtone, ringing volume in the external device can be turned up and down by the volume control instruction from the cell phone. However, when in-band ringtone ringing has not been set, the cell phone notifies the external device of the reception of the incoming call. When the in-band ringtone ringing has not been set, whether the ringtone rings in the external device is dependent on implementation of the external device, but it is usual that a specific ringtone held and generated in the external device is allowed to ring (refer to Bluetooth® Hands-Free Profile 1.5 (Bluetooth® SIG)).

However, such volume control may cause the following problems. First, for example, in the case in which a HFP connection is completely established between an external device supporting a volume control function and a cell phone supporting a Bluetooth® HFP, when a voice path is established in the cell phone during communication and the external device speaker is muted, although a user has performed a volume-up operation by using a volume adjustment means of the external device to turn up the volume of the cell phone during the communication, the communication volume of the cell phone is not changed and a volume setting value of the muted external device is increased. Thus, when releasing the muting of the external device after the voice path is switched to the external device, voice may ring with a high level.

Second, in the case of a cell phone that performs volume control with respect to an external device only when a voice path is not established only in the cell phone, if in-band ringtone notification becomes invalid when an incoming call has occurred, the cell phone cannot perform volume control using volume adjustment notification based on a volume adjustment operation of the external device.

DETAILED DESCRIPTION

Figure 1:
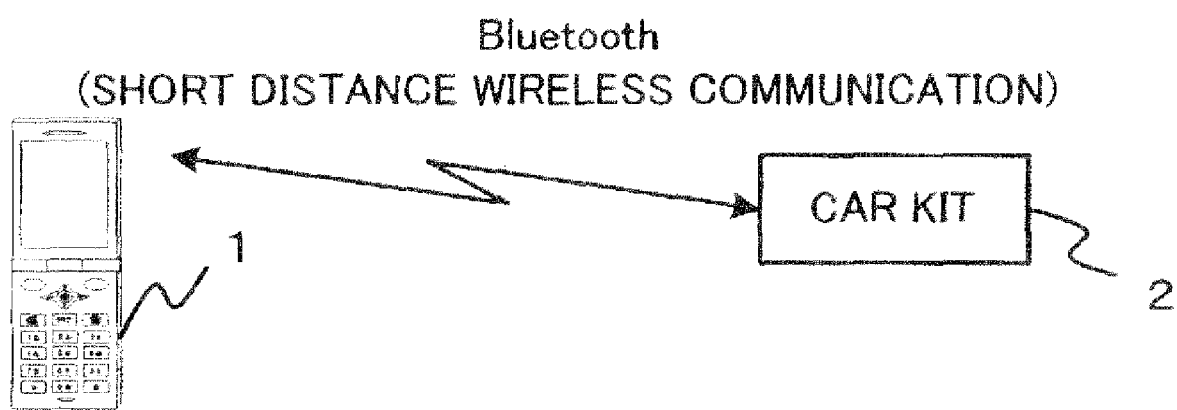
FIG. 1 is a diagram illustrating a relationship between a cell phone and equipment wirelessly connected to the cell phone according to an embodiment of the invention.
Figure 2:
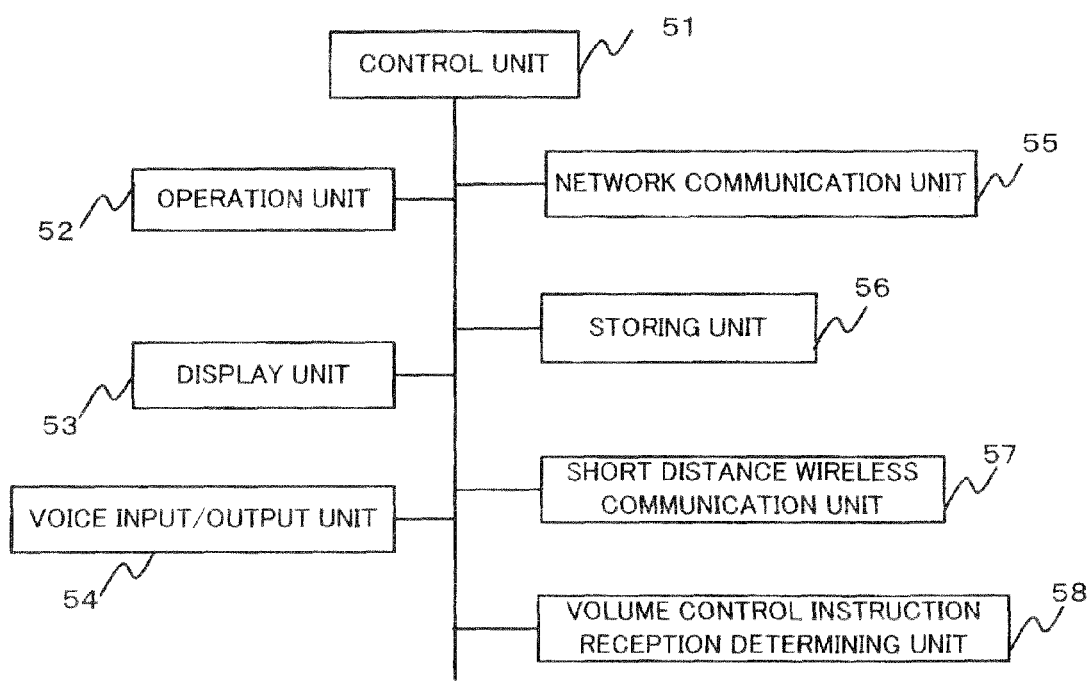
FIG. 2 is a block diagram illustrating the configuration of a cell phone according to an embodiment of the invention.

According to an embodiment of the invention, a wireless communication terminal comprising a network communication unit, short distance wireless communication unit, an input unit and a control unit. The network communication unit transmits radio signals to communication network via a base station. The short distance wireless communication unit transmits radio signals to and from an external device. The short distance wireless communication unit establishes a voice link between the wireless communication terminal and the external device to transmit sound data. The control unit discards a volume update notification received from the external device via the short distance wireless communication unit if the voice link has not been established. According to an aspect of the invention, it is possible to provide the wireless communication terminal capable of performing communication with external device after performing volume control of adjusting volume of the external device to an appropriate level.

The volume update notification reception determining unit 58 performs a determination of a response for volume update notification notified from an external device based on a incoming state and a voice link state according to the instructions from the control unit 51. The volume update notification reception determining unit 58 can be set in one of the following three modes. Further, the volume update notification reception determining unit 58 may have only one of the following three modes and may be selected from two of the three modes. In addition, any one of the three modes may be selected.

In a first mode, when a voice link has been established by the short distance wireless communication unit 57, the volume value of the external device notified through volume update notification is not discarded. However, when the voice link has not been established by the short distance wireless communication unit 57, the volume value of the external device notified through the volume update notification is discarded.

In a second mode, when the cell phone 1 is in the incoming state, the volume value of the external device notified through the volume update notification is not discarded. However, when the cell phone 1 is not in the incoming state, the volume value of the external device notified through the volume update notification is discarded.

In a third mode, when the voice link has been established by the short distance wireless communication unit 57 or the cell phone 1 is in the incoming state, the volume value of the external device notified through the volume update notification is not discarded. However, when the cell phone 1 is not in the incoming state in the case in which the voice link has not been established by the short distance wireless communication unit 57, the volume value of the external device notified through the volume update notification is discarded.

Further, the case in which the voice link has been established represents the state in which microphone input through the external device is encoded, is transmitted to the cell phone through the voice link and is regarded as microphone input of the cell phone, and data which must ring from the speaker of the cell phone is encoded, is transmitted to the external device through the voice link, and is decoded by the external device, and then is output from the speaker thereof. Further, the case in which the voice link has been established represents the case in which a communication is performed with a communication partner in the external device, a dial tone is notified to the external device, or an in-band ringtone is notified to the external device during the ringing of the in-band ringtone.

The case in which the volume value of the external device notified through the volume update notification is not discarded, for example, includes the case in which the cell phone 1 holds the volume value thereof. However, the case in which the notified volume value is not discarded is not necessarily limited to the case of holding the notified volume value. For example, when the volume update notification is received from the external device, the cell phone 1 may perform volume control instruction by using the volume value without holding the notified volume value of the external device.

Figure 3:
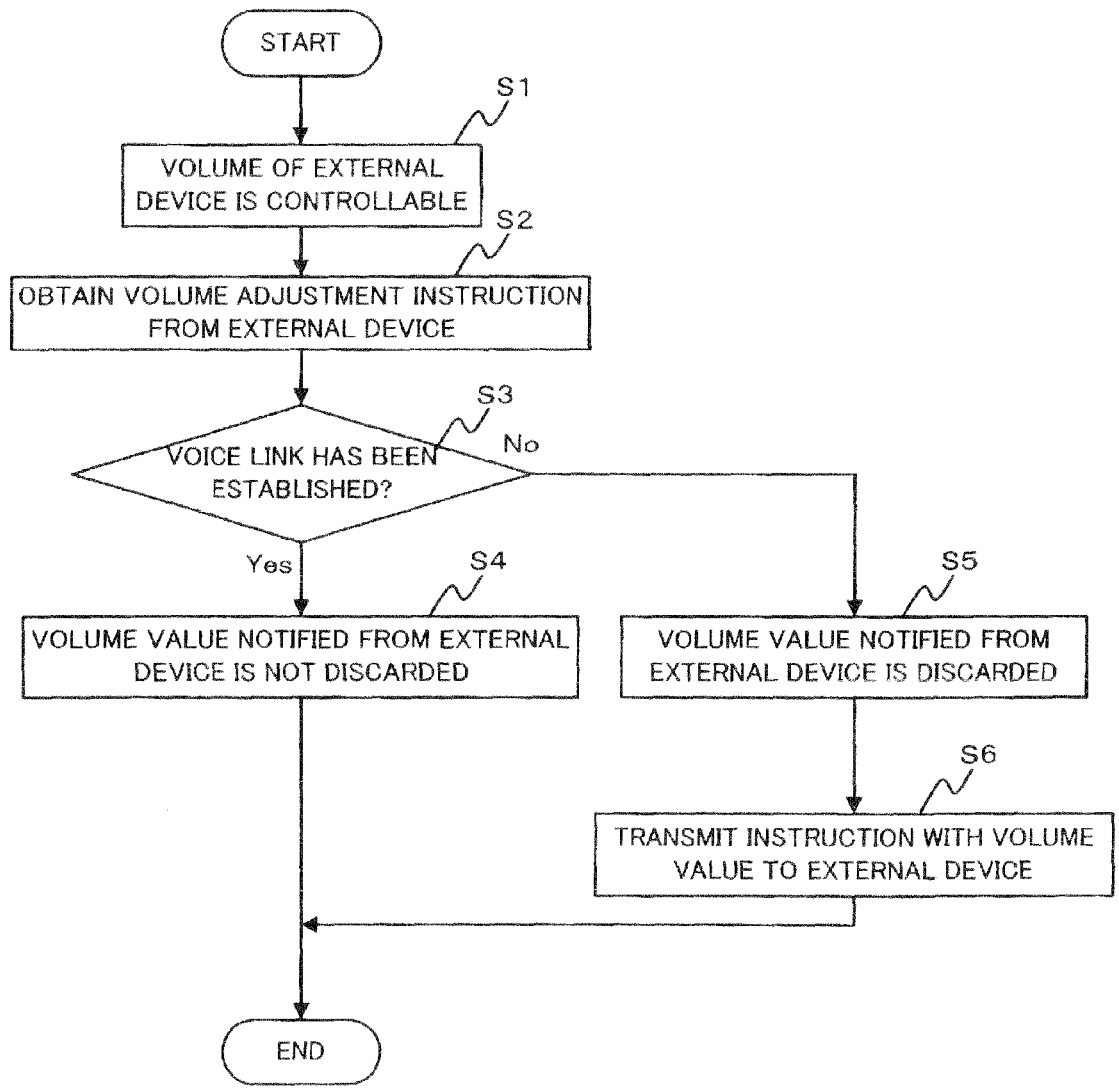
FIG. 3 is flowchart illustrating the process of a volume update notification reception determining unit of a cell phone according to an embodiment of the invention.

FIG. 3 is a flowchart illustrating the process of the volume update notification reception determining unit 58. The flowchart of FIG. 3 will be described on the assumption that the first mode has been set in the volume update notification reception determining unit 58. First, it is considered that the volume of the external device is controllable by the cell phone 1 (S1). That is, the cell phone 1 stores the Bluetooth® HFP. When the HFP connection is established between the external device and the cell phone 1, the cell phone 1 receives support function notification, which represents that a volume control function is supported, from the external device. After the HFP connection is established between the external device and the cell phone 1, the cell phone 1 receives initial volume update notification (representing an initial volume value of the external device) from the external device. In such a state, the cell phone 1 receives the volume update notification from the external device through the short distance wireless communication unit 57 (S2). Then, the volume update notification reception determining unit 58 determines whether the voice link has been established between the external device and the cell phone 1 (S3). As a result of the determination, if the voice link has been established therebetween (Yes of S3), the volume update notification reception determining unit 58 does not discard the volume value of the external device, which is notified from the external device, for example, holds the same (S4). However, if the voice link has not been established therebetween (No of S3), the volume update notification reception determining unit 58 discards the volume value of the external device, which is notified from the external device (S5). In the case of discarding the volume value notified from the external device, the volume update notification reception determining unit 58 transmits instruction with a volume value to the external device (S6).

Step S6 may be performed up to just before the voice link is established between the cell phone 1 and the external device, performed immediately after the voice link is established, or performed twice before and after the voice link is established. For example, when the voice link is established according to a user operation for voice transfer input through the operation unit 52 of the cell phone 1, the volume update notification reception determining unit 58 transmits the instruction with the volume value to the external device before the voice link is established based on the user operation. Thus, even if the volume of the external device is adjusted to a very high level, since a volume value notified from the cell phone 1 is set in the external device, it is possible to prevent sound with a high level from being suddenly output from the external device after the voice link is established. Further, when the voice link is established from the external device side, since the cell phone 1 transmits the instruction with the volume value to the external device immediately after the voice link is established, even if the volume of the external device has been set to a high level, the volume of the external device can be adjusted to an appropriate level based on the volume notified from the cell phone 1 immediately after the voice link is established. When the cell phone 1 transmits the instruction with the volume value to the external device twice before and after the voice link is established, in the case of external device receiving the instruction with the volume value even if there is no voice link, the volume of the external device can be adjusted to an appropriate level before the voice link is established. Even in the case of external device receiving the instruction only through the voice link, the volume of the external device can be adjusted to an appropriate level immediately after the voice link is established.

In the case of performing the volume control instruction, at least a volume value is transmitted to the external device. Further, when the volume control instruction is performed, information of images or characters representing that volume control is possible may be notified to the display unit 53. In addition, sound (for example, "beep-beep" sound) representing that the volume control is possible may be notified to the voice input/output unit 54. The volume value notified to the external device when the volume control instruction is performed may be a value held in advance, may be a value based on a value input via the operation unit 52, may be a value obtained by adding a predetermined value to a value displayed on the display unit 53 or subtracting the predetermined value from the displayed value, or may be a value set in the cell phone 1.

When the volume control instruction is not performed, at least the volume value is not transmitted to the external device. At this time, information of images or characters representing that the volume control is impossible may be notified to the display unit 53. In addition, sound (for example, "beep-beep-beep" sound) representing that the volume control is impossible may be notified to the voice input/output unit 54.

Furthermore, in the above description, the case in which the user operation for the voice transfer is input has been described as an example of an event serving as the beginning of the establishment of the voice link. However, the event for the establishment of the voice link is not limited to the operation for the voice transfer. For example, the voice link may be established to allow a ringtone to ring in the external device, or to allow a dial tone to ring in the external device. In any case, the volume value is transmitted to the external device in at least one of before and after the voice link is established. Thus, when (or immediately after) the voice link is established between the cell phone 1 and the external device, the external device can output sound with the volume instructed by the cell phone 1.

When the second mode is set in the volume update notification reception determining unit 58, the determination of Step S4 in the flowchart of FIG. 3 is replaced with a determination regarding whether the incoming call occurs in the cell phone 1. Further, when the third mode is set in the volume update notification reception determining unit 58, the determination of Step S4 is replaced with a determination regarding whether the cell phone 1 corresponds to at least one of "the state in which the voice link is established" and "the state in which the incoming call occurs".

In addition, the configurations and processing share of the short distance wireless communication unit 57, the control unit 51 and the volume update notification reception determining unit 58 are not limited thereto. For example, the volume update notification reception determining unit 58 may be included in the control unit 51.

Furthermore, the volume adjustment instruction is not necessarily obtained through an operation means of the external device. For example, when a communication is to be faded out, the volume adjustment instruction may be generated during the process of a control means of the external device.

Figure 4:
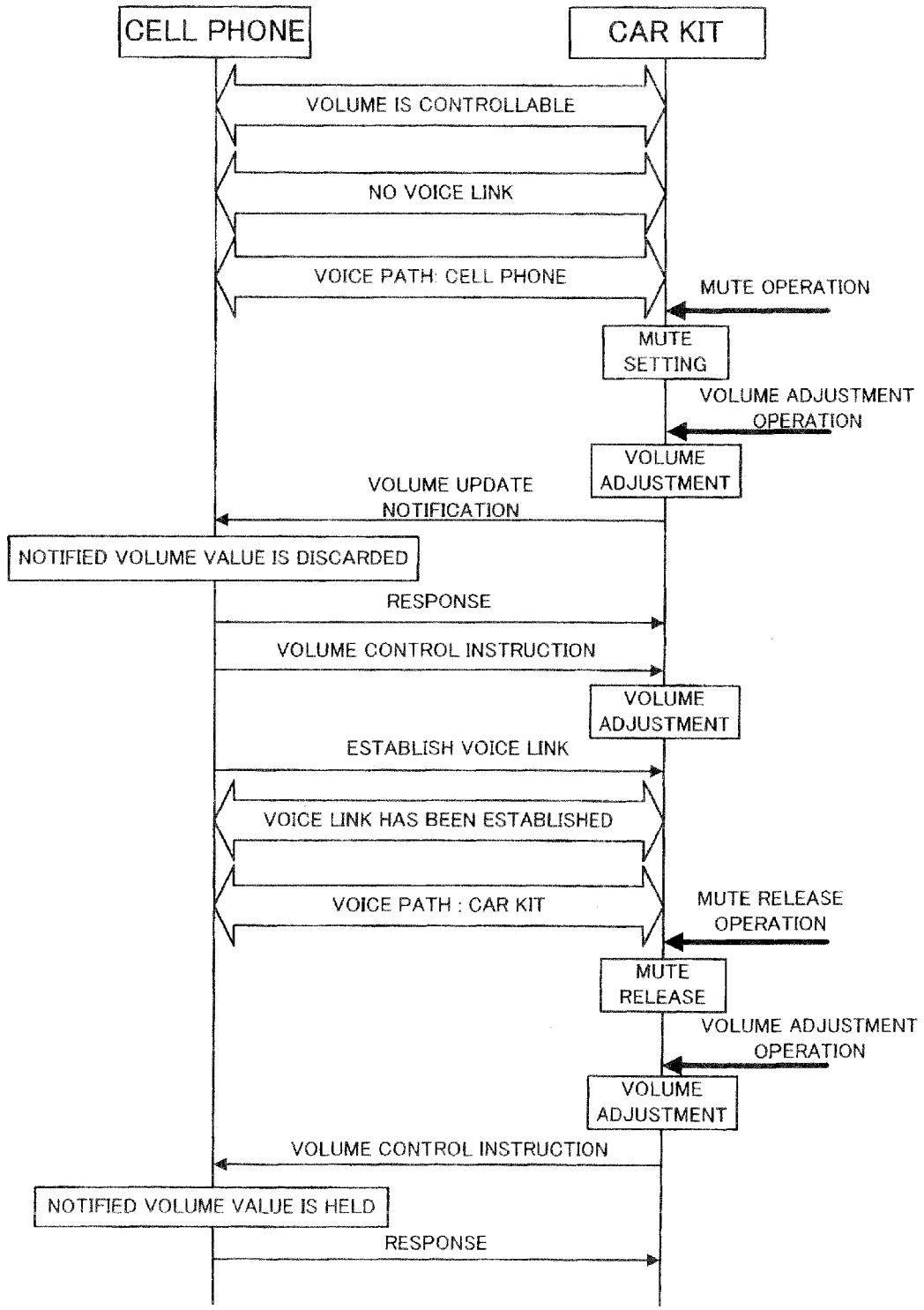
FIG. 4 is a sequence diagram illustrating a cell phone, in which a volume update notification reception determining unit is set in a first mode, and on-vehicle equipment according to an embodiment of the invention.

FIG. 4 is a sequence diagram illustrating the cell phone 1 having the above configuration, in which the volume update notification reception determining unit 58 is set in the first mode, and the on-vehicle equipment 2.

First, after the cell phone 1 is powered on, a standby screen is displayed on the display unit 53. The control unit 51 has variables for managing a HFP connection state, a support state of volume control and a volume update notification state. Immediately after the cell phone 1 is powered on, these variables represent no HFP connection, no support information and no volume update notification.

Next, a connection is established between lower layers of the on-vehicle equipment 2 and the cell phone 1, and the cell phone 1 receives support function notification from the on-vehicle equipment 2. If the control unit 51 recognizes that the on-vehicle equipment 2 supports the volume control through the support function notification received from the on-vehicle equipment 2, the control unit 51 changes the variable for managing the support state of the volume control to a variable representing that the on-vehicle equipment 2 supports the volume control. Further, if the HFP connection is established, the control unit 51 changes the variable representing the HFP connection state to a variable representing that the cell phone 1 is connected to the on-vehicle equipment 2 through the HFP connection. Further, after the HFP connection is established, if the cell phone 1 receives volume update notification, which represents the initial volume value of the on-vehicle equipment 2, from the on-vehicle equipment 2, the control unit 51 of the cell phone 1 changes the variable for managing the volume update notification state to a variable representing that the volume update notification has been performed. In this way, the cell phone 1 can control the volume of the on-vehicle equipment 2.

Consecutively, if an incoming call is received through the network communication unit 55 and a termination response signal is received via the operation unit 52, the cell phone 1 is in a communication state through a voice path. At this time, if a volume adjustment signal is received from the volume adjustment operating means of the on-vehicle equipment 2, the on-vehicle equipment 2 notifies the cell phone 1 of an adjusted volume value.

The cell phone 1 receives the volume update notification, which is output from the on-vehicle equipment 2, via the short distance wireless communication unit 57. Then, the volume update notification reception determining unit 58 determines whether to discard the volume value received from the on-vehicle equipment 2. When a mode set in the volume update notification reception determining unit 58 is the first mode, since the voice link has not been established between the cell phone 1 and the on-vehicle equipment 2, the volume update notification reception determining unit 58 discards the volume value received from the on-vehicle equipment 2. Even if the volume adjustment signal is continuously received plural times, the volume update notification reception determining unit 58 discards the volume value received from the on-vehicle equipment 2.

Due to such a determination of the volume update notification reception determining unit 58, even if the volume adjustment signal is received from the operation unit 52 of the cell phone 1, since the cell phone 1 discards the volume value notified from the on-vehicle equipment 2, the cell phone 1 does not memorize the adjusted volume of the on-vehicle equipment 2. For example, in the case of the cell phone 1 having a function of displaying the volume of the on-vehicle equipment 2 on the display unit 53, even if the volume of the on-vehicle equipment 2 is adjusted, the volume displayed on the display unit 53 is not adjusted.

If the operation unit 52 of the cell phone 1 is operated to establish a voice link between the cell phone 1 and the on-vehicle equipment 2 and a voice path is switched to the on-vehicle equipment 2, communication voice rings from the on-vehicle equipment 2. Herein, the cell phone 1 transmits the instruction with the volume value to the on-vehicle equipment 2 before transmitting an establishment request for the voice link to the on-vehicle equipment 2. After receiving the volume control instruction, the on-vehicle equipment 2 sets its own volume based on the notified volume value.

Thus, in the case in which the speaker of the on-vehicle equipment 2 is in a mute state, although the volume value operating means of the on-vehicle equipment 2 is operated so that the volume of the on-vehicle equipment 2 is adjusted to a high level, sound with a high level can be prevented from being suddenly output from the speaker of the on-vehicle equipment 2 when the speaker of the on-vehicle equipment 2 is released from the mute state.

Herein, if the volume adjustment signal is received from the volume adjustment operating means of the on-vehicle equipment 2, the on-vehicle equipment 2 notifies the cell phone 1 of the adjusted volume value.

The cell phone 1 receives the volume update notification, which is output from the on-vehicle equipment 2, via the short distance wireless communication unit 57. Then, the volume update notification reception determining unit 58 determines whether to discard the volume value received from the on-vehicle equipment 2. When the mode set in the volume update notification reception determining unit 58 is the first mode, since the voice link has been established between the cell phone 1 and the on-vehicle equipment 2, the volume update notification reception determining unit 58 does not discard the volume value received from the on-vehicle equipment 2.

Due to such a determination of the volume update notification reception determining unit 58, when the voice link has been established, it is determined that the notified volume of the external device is valid. For example, in the case of the cell phone 1 having a function of displaying the volume of the on-vehicle equipment 2 on the display unit 53, the volume displayed on the display unit 53 can be adjusted based on the volume value included in the volume adjustment signal from the on-vehicle equipment 2.

Figure 5:
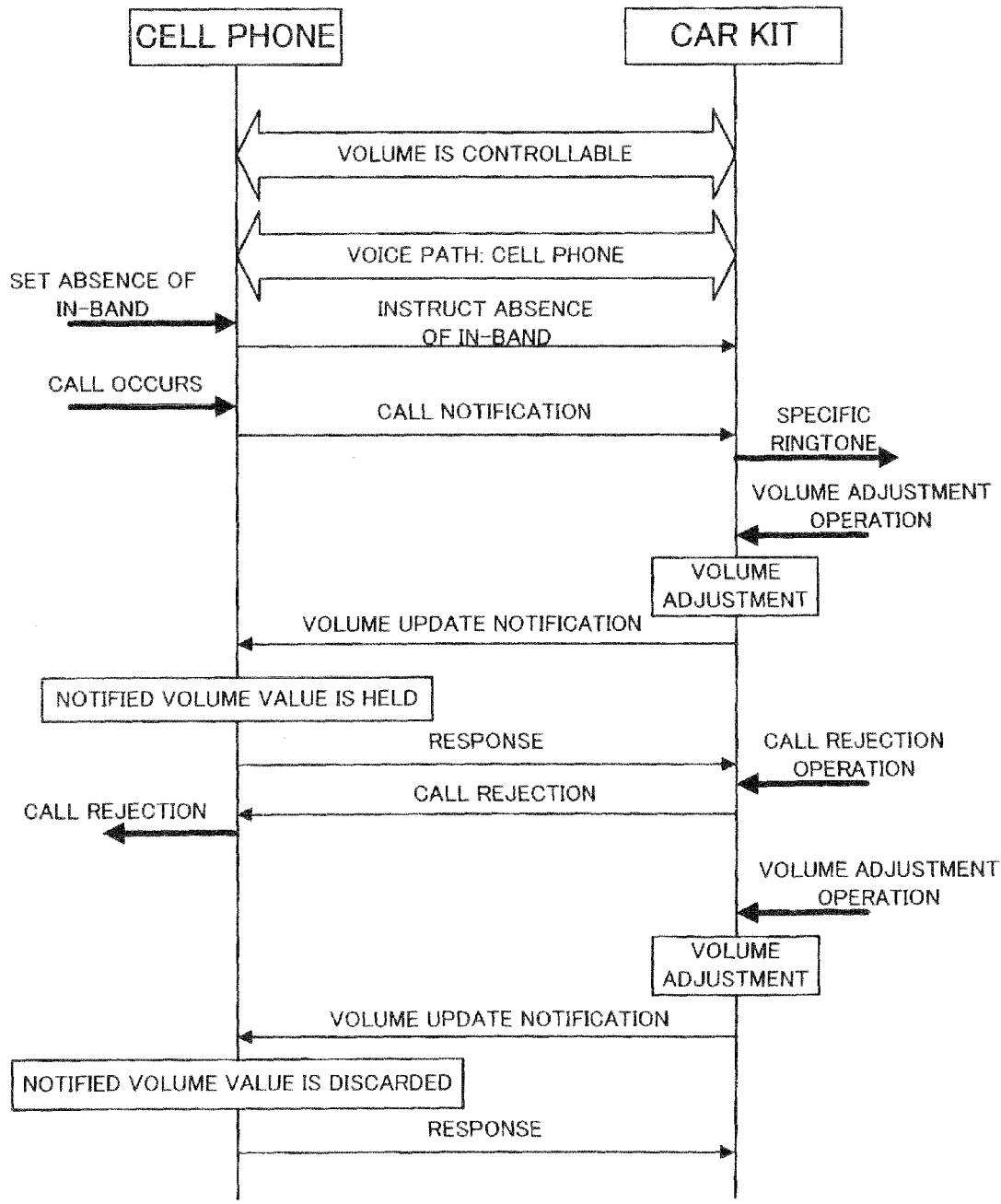
FIG. 5 is a sequence diagram illustrating a cell phone, in which a volume update notification reception determining unit is set in a second mode, and on-vehicle equipment according to an embodiment of the invention.
Figure 6:
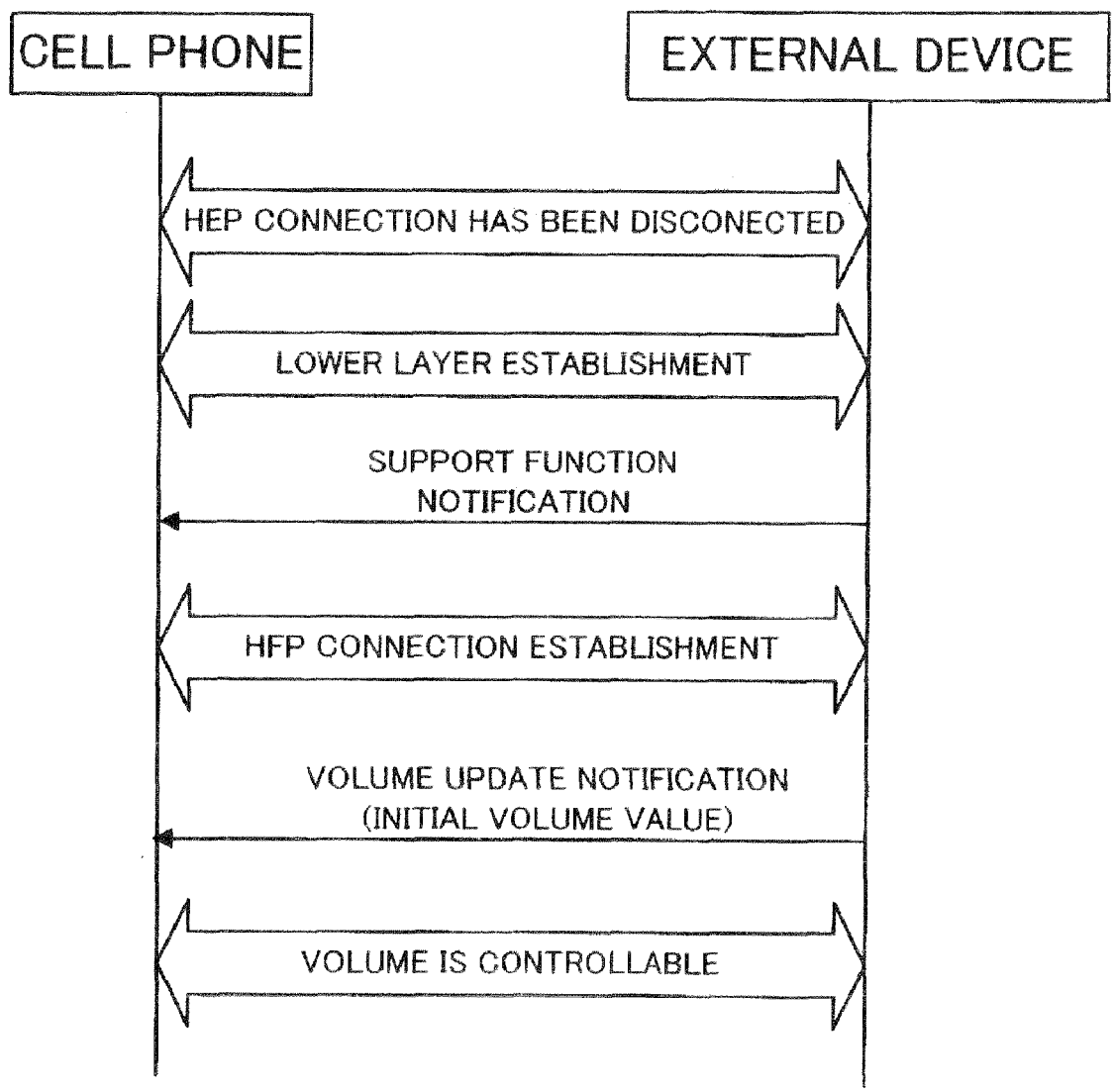
FIG. 6 is a sequence diagram illustrating the operation until a HFP connection is established between a cell phone and an external device and a volume controllable state is achieved.

FIG. 5 is a sequence diagram illustrating the cell phone 1, in which the volume update notification reception determining unit 58 is set in the second mode, and the on-vehicle equipment 2. In the sequence illustrated in FIG. 5, since the operation until the volume controllable state is achieved is identical to that of the sequence illustrated in FIG. 4, detailed description thereof will be omitted in order to avoid redundancy. The following description will be given on the assumption that the HFP connection is established between the cell phone 1 and the on-vehicle equipment 2, the cell phone 1 can control the volume of the on-vehicle equipment 2, and the voice path is established in the cell phone 1.

When an operation for setting absence of in-band is performed through the operation unit 52 of the cell phone 1, instruction indicating the absence of in-band is notified to the on-vehicle equipment 2 from the cell phone 1. If an incoming call is received through the network communication unit 55, the cell phone 1 notifies the on-vehicle equipment 2 of the reception of the incoming call. However, if the absence of in-band has been set, ringtones are not notified to the on-vehicle equipment 2 and only the information representing the reception of the incoming call is transmitted to the on-vehicle equipment 2. If only the information representing the reception of the incoming call is notified from the cell phone 1, the on-vehicle equipment 2 allows ringtones stored therein to ring.

At this time, if the volume adjustment signal is received from the volume adjustment operating means of the on-vehicle equipment 2, the on-vehicle equipment 2 notifies the cell phone 1 of an adjusted volume value.

The cell phone 1 receives the volume update notification, which is output from the on-vehicle equipment 2, via the short distance wireless communication unit 57. Then, the volume update notification reception determining unit 58 determines whether to discard the volume value received from the on-vehicle equipment 2. When the mode set in the volume update notification reception determining unit 58 is the second mode, since the cell phone 1 is in the incoming state, the volume update notification reception determining unit 58 does not discard the volume value received from the on-vehicle equipment 2.

As described above, when an incoming call occurs, the cell phone 1 determines that the volume value notified from the external device is valid to perform control (e.g., display using the display unit 53) using the volume value, and the like.

Then, if a call rejection signal is input to the on-vehicle equipment 2, the on-vehicle equipment 2 notifies the cell phone 1 of call rejection. After receiving the call rejection notification, the cell phone 1 controls the network communication unit 55 to complete the reception of an incoming call. If the reception of the incoming call is completed as described above, a standby state is achieved other than the incoming state and the communication state. When the call state of the cell phone 1 is not the incoming state, if the volume adjustment notification is received from the on-vehicle equipment 2, the volume update notification reception determining unit 58 discards the volume value received from the on-vehicle equipment 2 because the cell phone 1 is not in the incoming state.

As described above, the cases in which the volume update notification reception determining unit 58 is set in the first and second modes are described using the sequence diagrams illustrated in FIGS. 4 and 5. If the case, in which the volume update notification reception determining unit 58 is set in the third mode, corresponds to at least one of the case of determining that the volume value received from the external device is not discarded in the first mode and the case of determining the volume value received from the external device is not discarded in the second mode, it is determined that the volume value received from the external device is not discarded. Consequently, in the case in which the volume update notification reception determining unit 58 is set in the third mode, it is possible to determine the volume value received from the external device as the volume value of the external device even when the incoming call occurs as described using FIG. 5, in addition to the case of "the communication state" or the case of notifying the ringtone as described using FIG. 4.

In addition, the invention is not limited to the above embodiment and various modifications can be made without departing from the scope of the invention.

While certain embodiments of the inventions have been described, these embodiments have been presented by way of example only, and are not intended to limit the scope of the inventions. Indeed, the novel terminal described herein may be embodied in a variety of other forms; furthermore, various omissions, substitutions and changes in the form of the terminal described herein may be made without departing from the spirit of the inventions. The accompanying claims and their equivalents are intended to cover such forms or modifications as would fall within the scope and spirit of the inventions.

What is claimed is:

1. A wireless communication terminal comprising:
    a network communication unit configured to transmit radio signals to a communication network via a base station;
    a short distance wireless communication unit configured to transmit radio signals to and from an external device, the short distance wireless communication unit configured to establish a voice link between the wireless communication terminal and the external device to transmit sound data; and
    a control unit configured to discard a volume update notification received from the external device via the short distance wireless communication unit if the voice link has not been established, and to transmit an instruction with a volume value to the external device at least once before or after the voice link is established.

2. The wireless communication terminal according to claim 1, wherein the control unit is configured to receive the volume update notification after the control unit receives information indicating that the external device supports a volume control function and a volume value of the external device by using the short distance wireless communication unit.

3. The wireless communication terminal according to claim 1, wherein the control unit is configured to hold a volume update notification received from the external device via the short distance wireless communication unit if the voice link has been established.

4. A wireless communication terminal comprising:
   a network communication unit configured to transmit radio signals to a communication network via a base station;
   a short distance wireless communication unit configured to transmit radio signals to and from on-vehicle equipment, the short distance wireless communication unit establishes a voice link between the wireless communication terminal and the on-vehicle equipment to transmit sound data;
   an operation unit configured to accept an operation of setting absence of in-band, so that an instruction indicating the absence of in-band is sent to the on-vehicle equipment; and
   a control unit configured to discard a volume update notification received from the on-vehicle equipment via the short distance wireless communication unit if the wireless communication terminal is not receiving an incoming call, and to transmit an instruction with a volume value to the external device at least once before or after the voice link is established.

5. A sound volume control method applied to a wireless communication terminal which performs voice call with another terminal and short distance wireless communication with an external device, the method comprising:
   receiving a volume update notification from the external device by the short distance wireless communication,
   discarding the volume update notification if a voice link has not been established between the wireless communication terminal and the external device or if the wireless communication terminal is not receiving an incoming call, and
   transmitting an instruction with a volume value to the external device at least once before or after a voice link is established.

* * * * *